United States Patent
Sago et al.

(10) Patent No.: US 6,761,930 B2
(45) Date of Patent: *Jul. 13, 2004

(54) METHOD OF COATING SOLUTION ON SUBSTRATE SURFACE USING A SLIT NOZZLE

(75) Inventors: Hiroyoshi Sago, Ayase (JP); Shigemi Fujiyama, Kanagawa (JP); Futoshi Shimai, Fujisawa (JP); Akira Uehara, Yokohama (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 37 days.

This patent is subject to a terminal disclaimer.

(21) Appl. No.: 10/199,602

(22) Filed: Jul. 19, 2002

(65) Prior Publication Data

US 2003/0021906 A1 Jan. 30, 2003

Related U.S. Application Data

(63) Continuation of application No. 08/825,256, filed on Mar. 27, 1997, now Pat. No. 6,436,472, which is a continuation of application No. 08/564,708, filed on Nov. 29, 1995, now abandoned.

(30) Foreign Application Priority Data

Nov. 29, 1994 (JP) .............................................. 6-295143
Feb. 27, 1995 (JP) ............................................... 7-38350

(51) Int. Cl.[7] .............................................. B05D 1/42
(52) U.S. Cl. ......................... 427/240; 427/356; 427/420
(58) Field of Search ................................ 427/240, 356, 427/358, 420; 118/52, 410, DIG. 4

(56) References Cited

U.S. PATENT DOCUMENTS

| 5,234,499 A | * | 8/1993 | Sasaki et al. | 427/240 |
| 5,260,174 A | * | 11/1993 | Nakazawa et al. | 427/240 |
| 5,374,312 A | * | 12/1994 | Hasebe et al. | 118/52 |
| 6,436,472 B1 | * | 8/2002 | Sago et al. | 427/240 |

FOREIGN PATENT DOCUMENTS

| DE | 2746519 | * | 4/1978 | | 118/52 |
| JP | 63-156320 | | 6/1988 | | |
| JP | 04-332116 | | 11/1992 | | |
| JP | 5-185020 | * | 7/1993 | | 427/240 |
| JP | 6-103618 | * | 4/1994 | | 118/52 |
| JP | 06-151296 | | 5/1994 | | |

* cited by examiner

Primary Examiner—Katherine A. Bareford
(74) Attorney, Agent, or Firm—Carrier, Blackman & Associates, P.C.; Joseph P. Carrier; William D. Blackman

(57) ABSTRACT

A slit nozzle is positioned above a surface of a substrate placed in a rotary coater, and, while the slit nozzle is translated parallel to the surface of the substrate a coating solution is ejected from the slit nozzle toward the glass substrate under conditions such that the effects of surface tension of the solution are minimized or substantially cancelled out, to uniformly coat the coating solution on substantially the entire surface of the substrate with minimum wasting of the solution.

16 Claims, 6 Drawing Sheets

METHOD OF COATING SOLUTION ON SUBSTRATE SURFACE USING A SLIT NOZZLE

RELATED APPLICATIONS

This application is a continuation application of prior application Ser. No. 08/825,256, filed on Mar. 27, 1997, now U.S. Pat. No. 6,436,472, which is a File Wrapper Continuation of (abandoned). application Ser. No. 08/564,708, filed on Nov. 29, 1995.

BACKGROUND OF THE INVENTION

1. Field of the Invention

The present invention relates to a method of coating a coating solution such as a photoresist to the surface of a substrate such as a glass substrate, a semiconductor wafer, or the like.

2. Description of the Related Art

Photoresists for forming color filters are uniformly coated on the surface of a glass substrate for use in liquid-crystal display devices, and various coating solutions are uniformly coated on the surface of a semiconductor wafer. It has been customary to apply a uniform coating of such a coating solution by dropping the coating solution onto the center of the substrate and then rotating, with a spinner, the substrate to spread the dropped coating solution uniformly over the entire surface of the substrate under centrifugal forces.

According to the above coating process using a spinner, a large amount of coating solution tends to be scattered off the substrate because it is necessary to spread the coating solution dropped onto the center of the substrate uniformly outwardly to the peripheral edge of the substrate. As a result, the coating solution is consumed in a large quantity.

Use of a slit nozzle for minimizing the amount of coating solution consumed is disclosed in Japanese laid-open patent publications Nos. 63-156320, 4-332116, and 6-151296.

According to the processes disclosed in Japanese laid-open patent publications Nos. 63-156320 and 4-332116, while the slit nozzle positioned above a substrate is being translated parallel to the substrate, a coating solution is dropped from the slit nozzle onto the substrate. After the coating solution is deposited to a somewhat uniform thickness on the surface of the substrate, the substrate is rotated to uniformize the thickness of the coating solution thereon. However, since the coating solution is simply dropped on the surface of the substrate, the coating solution cannot completely uniformly be deposited because of the surface tension of the dropped coating solution. Therefore, it is necessary to apply a large amount of coating solution in order to form a uniform film of coating solution on the substrate. Another problem is that because the substrate is rotated in an atmosphere vented to the ambient air, the solvent in the coating solution tends to be evaporated quickly, making the coating solution more viscous soon. Therefore, it soon becomes difficult to spread the coating solution uniformly over the entire surface of the substrate.

According to the process revealed in Japanese laid-open patent publication No. 6-151296, the tip end of the slit nozzle is used to uniformize the thickness of a film of coating solution on the surface of a substrate. However, the slit nozzle is liable to be smeared with coating solution as its tip end contacts the coating solution. Further, the coated film tends to become irregular in thickness when the slit nozzle is lifted off the coating solution after the coating solution is deposited on the substrate.

SUMMARY OF THE INVENTION

It is therefore an object of the present invention to provide a method of coating a coating solution quickly to a thin uniform thickness on the surface of a substrate.

According to an aspect of the present invention, there is provided a method of coating a solution on a surface of a substrate, comprising the steps of positioning a slit nozzle above the substrate, ejecting the solution from the slit nozzle toward the surface of the substrate so as to minimize effects of surface tension of the solution when the solution is brought into contact with the surface of the substrate, and translating the slit nozzle parallel to the substrate to coat the solution on substantially the entire surface of the substrate while the solution is being ejected from the slit nozzle without interruption.

According to another aspect of the present invention, there is also provided a method of coating a solution on a surface of a substrate, comprising the steps of positioning a slit nozzle above the substrate, and coating the solution on substantially the entire surface of the substrate using a slit nozzle by ejecting without interruption the solution from the slit nozzle toward the surface of the substrate so as to substantially cancel out the effects of the surface tension of the solution when the solution is brought into contact with the surface of the substrate.

The effects of the surface tension of the solution may be reduced, minimized or substantially cancelled out by reducing the distance between a lower end of the slit nozzle and the surface of the substrate and pressurizing the solution. Specifically, when the solution has a viscosity of at most 10 cP, it may be pressurized under a pressure ranging from 0.5 $kg/cm^2$ to 10 $kg/cm^2$, and the distance between the lower end of the slit nozzle and the surface of the substrate may be at most 10 mm.

Since the distance between the lower end of the slit nozzle and the surface of the substrate is reduced and the solution is pressurized according to some of the aforementioned aspects of the invention, it is possible to apply, to the solution, forces tending to cancel out or minimize effects of the surface tension of the solution when it is brought into contact with the surface of the substrate.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENTS

Figure 1:
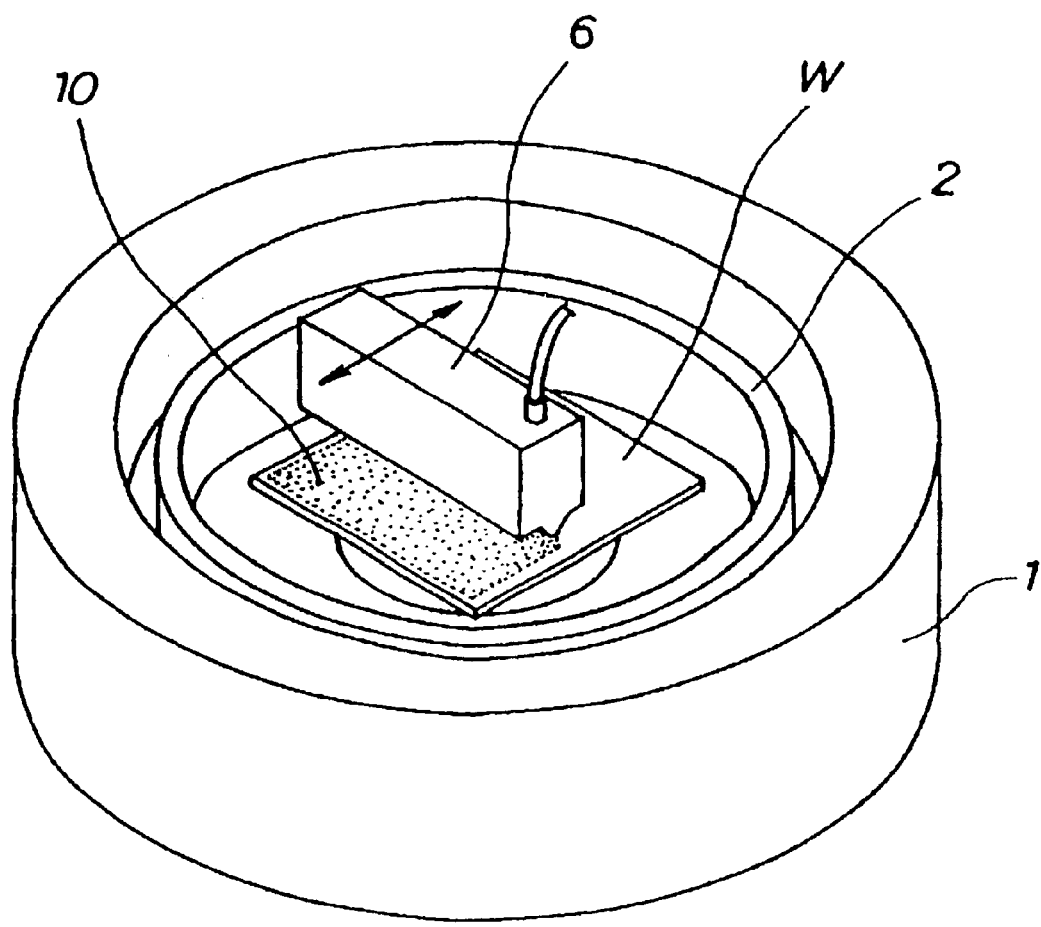
FIG. 1 is a perspective view of a rotary-cup coating apparatus used to carry out a coating method according to an embodiment of the present invention.
Figure 2:
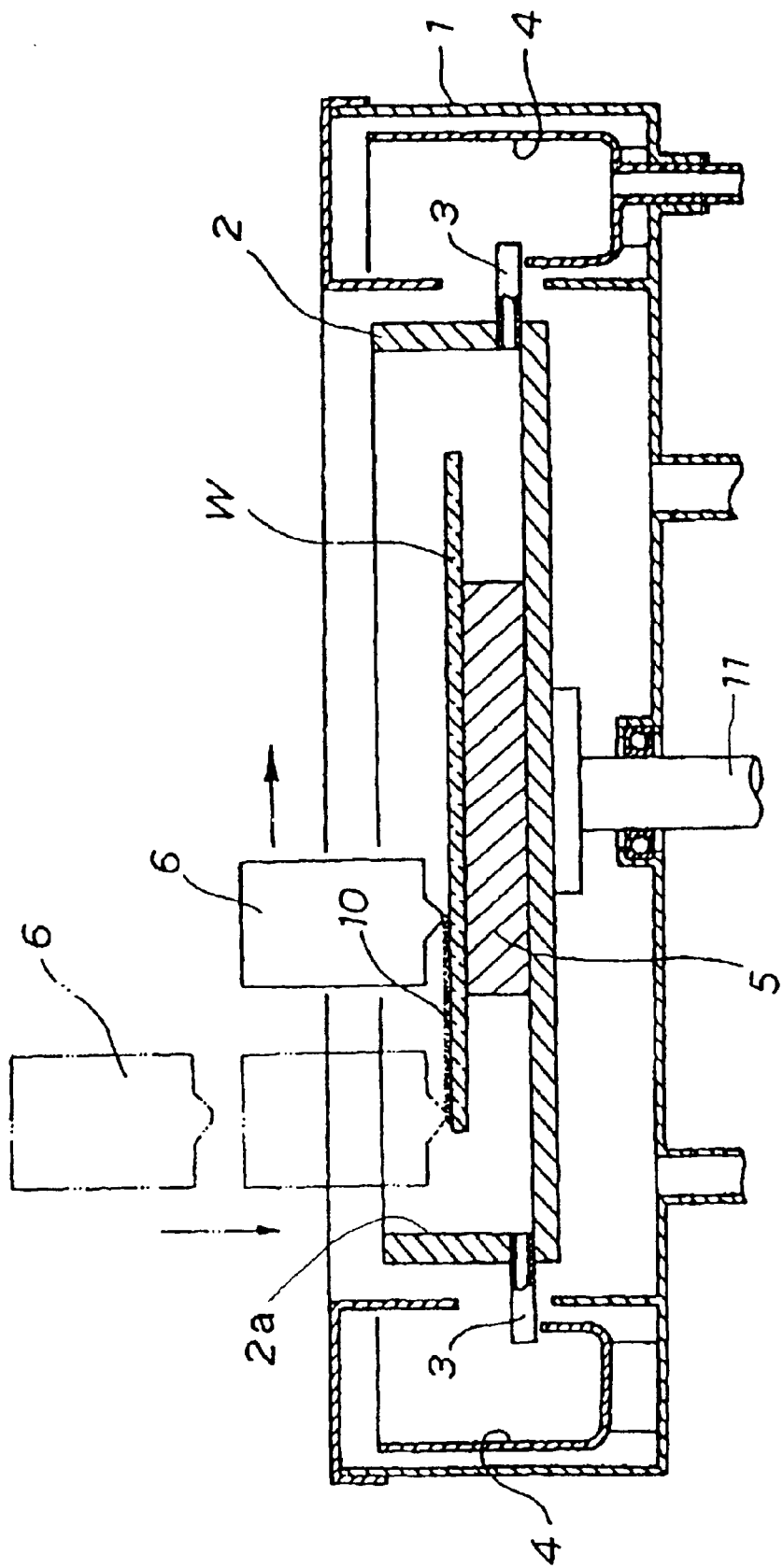
FIG. 2 is a vertical cross-sectional of the coating apparatus shown in FIG. 1.
Figure 3:
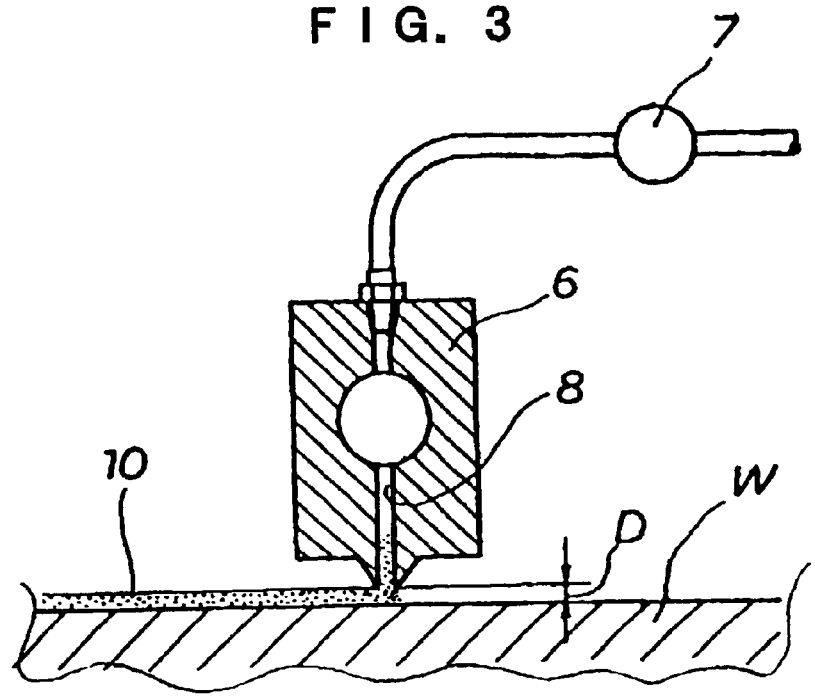
FIG. 3 is a cross-sectional view of a slit nozzle used in the coating apparatus shown in FIG. 1.

FIGS. 1 through 3 show a rotary-cup coating apparatus used to carry out a coating method according to an embodiment of the present invention.

As shown in FIGS. 2 and 3, the rotary-cup coating apparatus has an outer cup 1 and an inner cup 2 disposed in the outer cup 1 and rotatable by a spinner 11.

Drain pipes 3 extend radially outwardly from a circumferential wall 2a of the inner cup 2 and have outer distal ends opening in an annular liquid retrieval passage 4 disposed in the outer cup 1. A chuck 5 for attracting and holding a rectangular glass substrate W thereon is disposed centrally in the inner cup 2.

A slit nozzle 6 is normally disposed upwardly of the inner cup 2. The slit nozzle 6 is supported on an arm (not shown) which can be moved to displace the slit nozzle 6 in vertical directions and also horizontal directions parallel to the upper surface of the glass substrate W.

The slit nozzle 6 is supplied with a coating solution through a pressurizing unit 7 (see FIG. 3). As shown in FIG. 3, the slit nozzle 6 has a single nozzle hole 8 defined vertically therein for ejecting the coating solution supplied through the pressurizing unit 7. The nozzle hole 8 has a slit of certain width which is open at the lower end of the slit nozzle 6.

Figure 4:
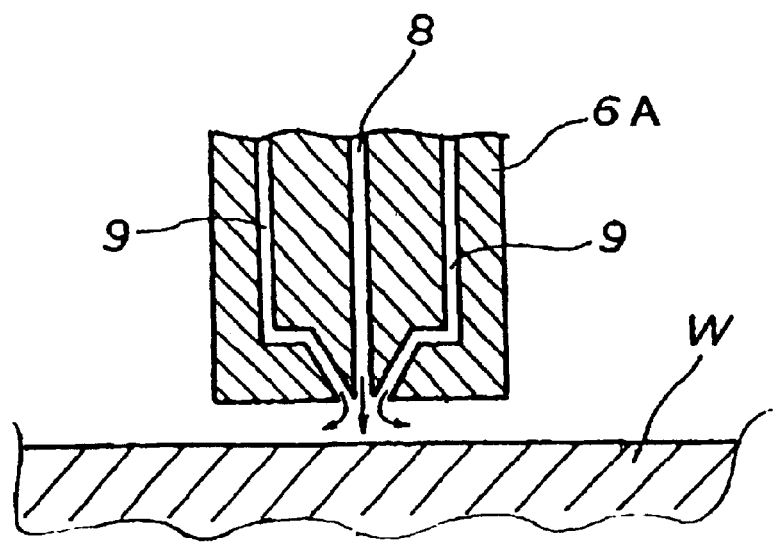
FIG. 4 is an enlarged fragmentary cross-sectional view of a slit nozzle according to another embodiment of the present invention.

FIG. 4 shows a slit nozzle 6A according to another embodiment of the present invention. The slit nozzle 6A may, as depicted, have a central nozzle hole 8 defined therein and a pair of gas ejection holes 9 defined therein one on each side of, i.e., forward and backward of, the central nozzle hole 8. When the gas ejection holes 9 eject a gas from their lower ends, the ejected gas tends to draw a coating solution from the central nozzle hole 8.

In the slit nozzles 6, 6A shown in FIGS. 3 and 4, a plurality of nozzle holes may be defined instead of the single nozzle hole 8.

According to the coating method of the invention, a coating solution is coated on the glass substrate W by the coating apparatus as follows:

As shown in FIG. 2, the slit nozzle 6 is positioned closely above an end of the glass substrate W. While a coating solution 10 which is pressurized by the pressurizing unit 7 is being ejected from the slit nozzle 6 toward the glass substrate W, the slit nozzle 6 is translated parallel to the glass substrate W. The slit nozzle 6 is moved to the other end of the glass substrate W while ejecting the coating solution 10 under pressure until the coating solution 10 is applied to substantially the entire upper area of the glass substrate W. Thereafter, the inner cup 2 is rotated about its center by the spinner 11 to rotate the glass substrate W therewith for thereby spreading the applied coating solution 10 uniformly over the upper surface of the glass substrate W under centrifugal forces.

Since the inner cup 2 and the glass substrate W are rotated in unison with each other, any turbulent air flows over the glass substrate W are minimized, allowing the coating solution 10 to be formed into a uniform coated film on the glass substrate W.

In the above coating method, the slit nozzle 6 starts and stops applying the coating solution 10 in positions directly above the opposite ends of the glass substrate W. However, the slit nozzle 6 may start and stop applying the coating solution 10 in positions that are spaced outwardly from the opposite ends of the glass substrate W. With such a modified coating process, it is possible to coat the coating solution uniformly up to the ends of the glass substrate W though a certain amount of coating solution is wasted because it is ejected from the slit nozzle 6 even when the slit nozzle 6 is positioned off the opposite ends of the glass substrate W.

Before the applied coating solution is uniformly spread over the glass substrate W upon rotation thereof, it is preferable to apply the coating solution in as thin and uniform a film as possible on the glass substrate W with the slit nozzle 6. To this end, the surface tension of the coating solution should be reduced when the coating solution is ejected from the slit nozzle 6 toward the surface of the glass substrate W.

Factors involved in the surface tension of the coating solution include (1) the viscosity (cP) of the coating solution, (2) the pressure ($kg/cm^2$) applied to the coating solution, (3) the distance (mm) between the lower end of the slit nozzle and the surface of the substrate, (4) the speed at which the slit nozzle moves, (5) the surface roughness of the substrate, and (6) the temperature.

A photoresist for forming a color filter, for example, has a normal viscosity of 10 cp or less. If the above factors or conditions (4) through (6) are fixed with respect to a coating solution whose viscosity is 10 cp or less, then the pressure P applied to the coating solution should preferably range from 0.5 ($kg/cm^2$) to 10 ($kg/cm^2$), and the distance D between the lower end of the slit nozzle and the surface of the substrate should preferably be 10 (mm) or less. Generally, the distance D should be as small as possible. However, if the distance D were too small, the coating solution would be deposited on and tend to smear a lower surface of the slit nozzle. Therefore, the distance D should be of a value which falls in a range not to deposit the coating solution to the lower surface of the slit nozzle.

Since the distance between the lower end of the slit nozzle 6 and the glass substrate W is relatively small and the coating solution ejected from the slit nozzle 6 is pressurized by the pressurizing unit 7, forces act on the ejected coating solution to cancel out or minimize the surface tension of the coating solution. Consequently, the coating solution can be coated quickly as a thin and uniform film on the surface of the glass substrate W, and the amount of the coating solution that is consumed to coat the glass substrate W is greatly reduced.

Figure 5:
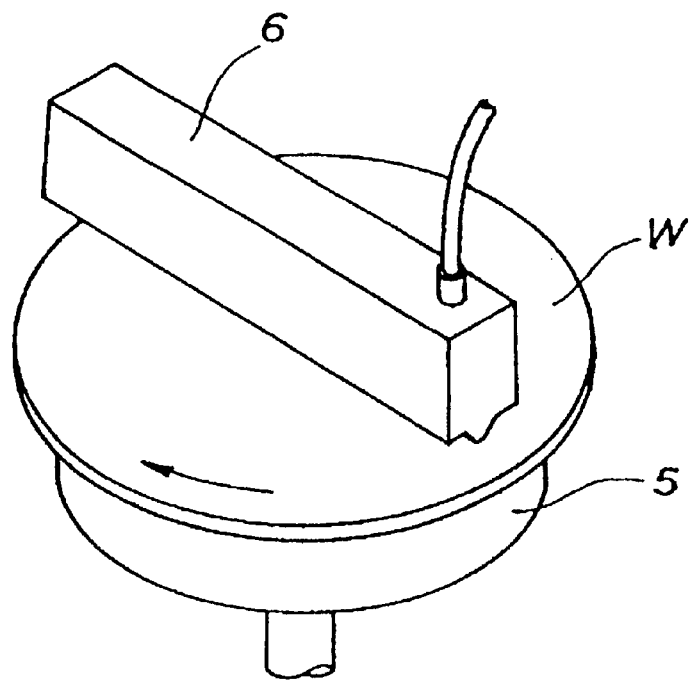
FIG. 5 is a perspective view showing the manner in which a coating solution is coated on a semiconductor wafer by the coating apparatus.

FIG. 5 shows the manner in which a coating solution is coated on a rotating circular semiconductor wafer W as the substrate. In FIG. 5, the slit nozzle 6 is positioned above the semiconductor wafer W. While a coating solution of reduced surface tension is being ejected from the slit nozzle 6, the semiconductor wafer W on the chuck 5 is rotated at a low speed. After the coating solution has been applied to substantially the entire surface of the semiconductor wafer W, the semiconductor wafer W is rotated at a high speed, greater than the low speed, to spread the coating solution uniformly over the surface of the semiconductor wafer W.

An experiment was conducted to evaluate the uniformities of coated films on glass substrates when a coating solution was dropped under different pressures and in different quantities. Specifically, a photoresist having a viscosity of 6.5 cP for forming a color filter was coated on a glass substrate having a size of 200 mm×200 mm by the slit nozzle shown in FIG. 4 at a temperature of 23° C. and a humidity of 50%, when the slit nozzle was moved at a speed of 500 mm/s and spaced from the glass substrate by a distance of 5 mm. After the photoresist was coated at different pressures (kg/cm$^2$) applied thereto and in different dropped quantities (g), glass substrates were rotated at 700 rpm for 6 seconds. The uniformities of coated films on the glass substrates are given in the following table:

| Pressure (kg/cm$^2$) | 0.6 | 0.7 | 0.9 | 0.9 | 1.0 |
|---|---|---|---|---|---|
| Dropped quantity (g) | 0.72 | 0.85 | 1.02 | 1.15 | 1.26 |
| Average film thickness (μm) before being rotated | 2.80 | 3.35 | 4.10 | 4.68 | 5.18 |
| Uniformity (±%) | 13.8 | 14.1 | 7.93 | 11.2 | 5.31 |
| Average film thickness (μm) after being rotated | 1.80 | 1.82 | 1.81 | 1.84 | 1.80 |
| Uniformity (±%) | 10.3 | 5.78 | 2.76 | 2.72 | 3.05 |

When a conventional slit nozzle was used, a pressure of 1.0 kg/cm$^2$ was required to be applied to the coating solution, and 3.00 g of a photoresist was needed to cover the entire surface of the glass substrate. With the conventional slit nozzle, the average film thickness was 1.82 μm, and the uniformity was ±2.84%.

Figure 6:
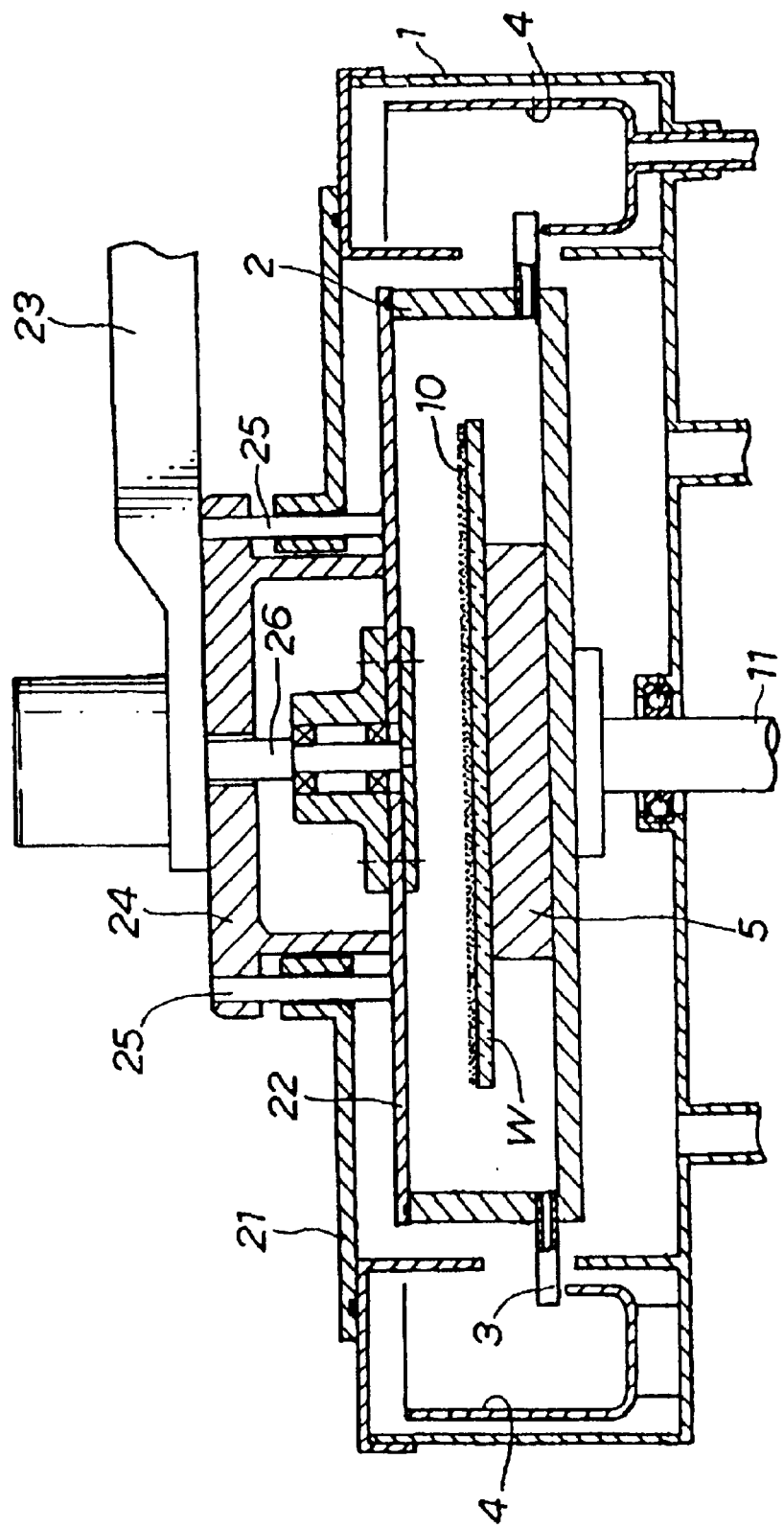
FIG. 6 is a vertical cross-sectional view of a rotary-cup coating apparatus with a lid assembly according to still another embodiment of the present invention.

FIG. 6 shows of a rotary-cup coating apparatus according to still another embodiment of the present invention. The rotary-cup coating apparatus shown in FIG. 6 has a lid assembly composed of lids 21, 22 for closing the respective upper openings of outer and inner cups 1, 2. The rotary-cup coating apparatus also includes an arm 23 which is movable linearly, angularly, and/or vertically, and a support block 24 fixed to a distal end of the arm 23. The lid 21 for closing the upper opening of the outer cup 1 is vertically slidably attached to the support block 24 by pins 25, and the lid 22 for closing the upper opening of the inner cup 2 is rotatably mounted on a shaft 26 disposed centrally on the support block 24.

To close the upper openings of the outer and inner cups 1,2, the arm 23 is moved to position the lids 21, 22 above the outer and inner cups 1, 2, and then is lowered. When the arm 23 is lowered, the lid 21 closes the upper opening of the outer cup 1. Upon continued descent of the arm 23, the support block 24 and the lid 22 are lowered until the lid 22 closes the upper opening of the inner cup 2.

After the upper openings of outer and inner cups 1, 2 have been closed respectively by the lids 21, 22, the concentration of volatilized solvent from the coating solution in the inner cup 2 is increased, and any evaporation of the solvent from the coating solution is minimized. Therefore, the coating solution does not become excessively viscous and can smoothly be spread over the glass substrate W.

A flow-rectifying plate (not shown) may be attached to the lower surface of the lid 22. When the lid 22 is closed, only a small gap is created between the flow-rectifying plate and the glass substrate W, while the flow rectifying plate and the substrate W are rotated together, for thereby pre-venting turbulent air flows from being developed in the inner cup 2. Therefore, a more uniformly coated film can be produced on the glass substrate W.

Figure 7:
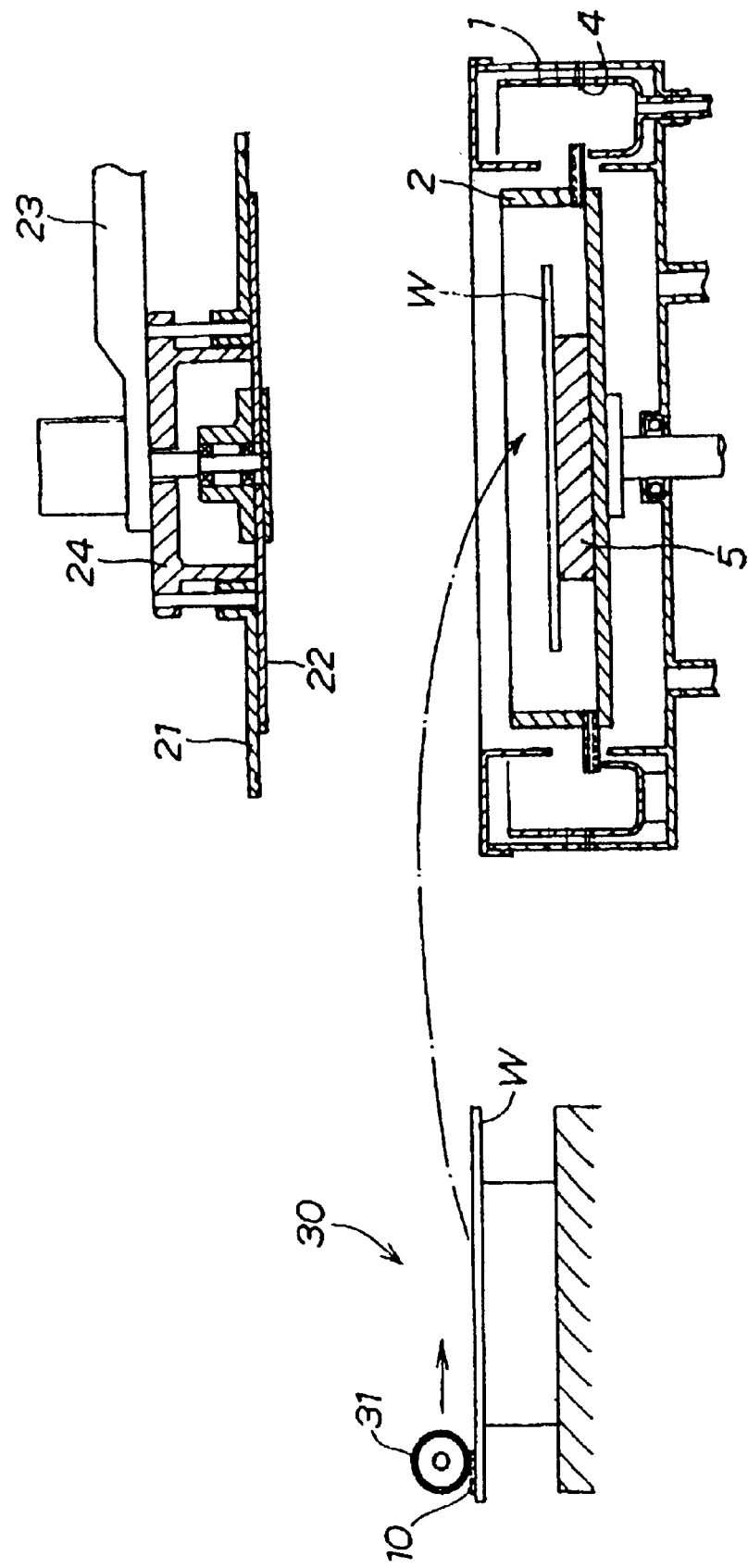
FIG. 7 is a vertical cross-sectional view showing the manner in which a coating solution is roughly coated on a substrate outside of the rotary-cup coating apparatus shown in FIG. 6.

FIG. 7 shows a coating method according to another embodiment of the present invention. In the previous embodiments, a coating solution is applied to substantially the entire surface of a substrate within the rotary-cup coating apparatus. According to the embodiment shown in FIG. 7, however, a coating station 30 is located outside of the rotary-cup coating apparatus shown in FIG. 6. In the coating station 30, a coating solution 10 is roughly coated on substantially the entire surface of a substrate W by a roll coater 31, for example. Thereafter, the substrate W is taken out of the coating station 30, and set in the inner cup 2 of the rotary-cup coating apparatus. Then, the upper openings of outer and inner cups 1, 2 are closed respectively by the lids 21, 22, and the inner cup 2 is rotated to spread the applied coating solution 10 uniformly over the surface of the substrate W under centrifugal forces.

Figure 8:
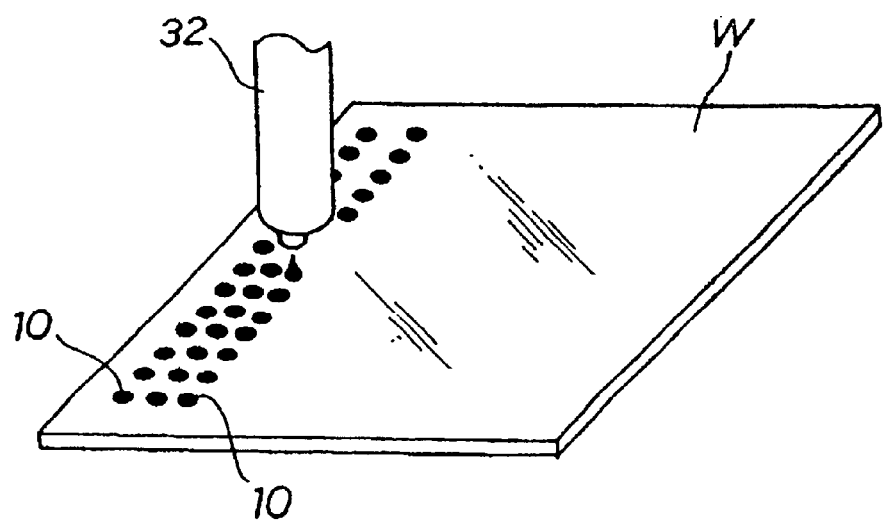
FIG. 8 is a perspective view showing the manner in which a coating solution is roughly coated substantially entirely on the surface of a glass substrate by a jet nozzle.

In the above embodiments, the slit nozzles 6, 6A and the roll coater 31 are illustrated as means for roughly coating the coating solution on substantially the entire surface of the substrate W. However, as shown in FIG. 8, a jet nozzle 32 may be used to apply dots of coating solution 10 to substantially the entire surface of the substrate W, and after the dots of coating solution 10 have been applied, the substrate W may be rotated to spread the coating solution 10 uniformly over the surface of the substrate W under centrifugal forces.

Alternatively, a bar coater, a flow coater, a sprayer, an electrostatic coating device, or the like may be used as means for roughly coating the coating solution on substantially the entire surface of the substrate W.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. The scope of the invention is indicated by the appended claims rather than by the foregoing description.

We claim:

1. A method of coating a solution on a surface of a substrate, comprising the steps of:
   positioning a slit nozzle above the substrate;
   ejecting the solution from the slit nozzle toward the surface of the substrate so as to minimize effects of surface tension of the solution when the solution is brought into contact with the surface of the substrate; and
   translating the slit nozzle parallel to the substrate to coat the solution on substantially the entire surface of the substrate while the solution is being ejected from the slit nozzle without interruption.

2. A method according to claim 1, wherein the effects of surface tension of the solution are minimized by reducing a distance between a lower end of the slit nozzle and the surface of the substrate to a value of 10 mm and by pressurizing the solution.

3. A method according to claim 2, wherein said solution has a viscosity of at most 10 cP and is pressurized under a pressure ranging from 0.5 kg/cm$^2$ to 10 kg/cm$^2$.

4. A method according to claim 1, wherein a tip end of said nozzle is maintained out of contact with said solution after the solution is ejected from the nozzle onto the substrate.

5. A method according to claim 1, wherein said substrate is rectangular or circular.

6. A method according to claim 1, wherein said substrate is substantially planar.

7. A method according to claim 1, wherein the solution is ejected from the nozzle so as to substantially cancel out the effects of the surface tension of the solution when the solution is brought into contact with the surface of the substrate.

8. A method according to claim 1, wherein said substrate is rotated during said coating step.

9. A method according to claim 8, wherein said solution has a viscosity of at most 10 cP and is pressurized under a pressure ranging from 0.5 kg/cm² to 10 kg/cm².

10. A method of coating a solution on a surface of a substrate, comprising the steps of:
    positioning a slit nozzle above the substrate; and
    coating the solution on substantially the entire surface of the substrate using a slit nozzle by ejecting without interruption the solution from the slit nozzle toward the surface of the substrate so as to substantially cancel out the effects of the surface tension of the solution when the solution is brought into contact with the surface of the substrate.

11. A method according to claim 10, wherein the effects of surface tension of the solution are substantially cancelled out by reducing a distance between a lower end of the slit nozzle and the surface of the substrate to a value of 10 mm and by pressurizing the solution.

12. A method according to claim 10, wherein a tip end of said nozzle is maintained out of contact with said solution after the solution is ejected from the nozzle onto the substrate.

13. A method according to claim 10, wherein said substrate is rectangular or circular.

14. A method according to claim 10, wherein said substrate is substantially planar.

15. A method according to claim 10, wherein said substrate is rotated during said coating step.

16. A method according to claim 10, wherein said slit nozzle is translated parallel to the substrate during said coating step.

* * * * *

UNITED STATES PATENT AND TRADEMARK OFFICE
CERTIFICATE OF CORRECTION

PATENT NO. : 6,761,930 B2  Page 1 of 1
APPLICATION NO. : 10/199602
DATED : July 13, 2004
INVENTOR(S) : Sago et al.

It is certified that error appears in the above-identified patent and that said Letters Patent is hereby corrected as shown below:

Column 2:
Line 54, change "vertical cross-sectional of" to --vertical cross-sectional view of--.

Column 5:
Line 29, change "shows of a rotary-cup" to --shows a rotary-cup--.
Line 60, change "pre-venting" to --preventing--.

Column 6:
Line 53, change "value of 10 mm" to --value of ≤10 mm--.

Column 8:
Line 2, change "value of 10 mm" to --value of ≤10 mm--.

Signed and Sealed this

Twenty-second Day of June, 2010

David J. Kappos
*Director of the United States Patent and Trademark Office*